United States Patent
Kuo et al.

(10) Patent No.: US 10,043,950 B2
(45) Date of Patent: Aug. 7, 2018

(54) SEMICONDUCTOR LIGHT-EMITTING STRUCTURE WITH METAL LAYER AND DISTRIBUTED BRAGG REFLECTOR AND SEMICONDUCTOR PACKAGE STRUCTURE THEREOF

(71) Applicant: Lextar Electronics Corporation, Hsinchu (TW)

(72) Inventors: Shiou-Yi Kuo, Kaohsiung (TW); Chao-Hsien Lin, New Taipei (TW); Ya-Ru Yang, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/293,403

(22) Filed: Oct. 14, 2016

(65) Prior Publication Data

US 2017/0155018 A1  Jun. 1, 2017

(30) Foreign Application Priority Data

Nov. 27, 2015  (TW) ............................... 104139725 A

(51) Int. Cl.
*H01L 33/46* (2010.01)
*H01L 33/32* (2010.01)
(Continued)

(52) U.S. Cl.
CPC .............. *H01L 33/46* (2013.01); *H01L 33/32* (2013.01); *H01L 33/382* (2013.01);
(Continued)

(58) Field of Classification Search
CPC ....... H01L 33/46; H01L 33/465; H01L 33/60; H01L 33/382
See application file for complete search history.

(56) References Cited

U.S. PATENT DOCUMENTS 8,237,184 B2  8/2012  Kuo
8,299,483 B2  10/2012  Lu et al.
(Continued)

FOREIGN PATENT DOCUMENTS

CN         204792880 U    11/2015
KR       1020050040161     5/2005
(Continued)

*Primary Examiner* — Laura Menz
*Assistant Examiner* — Candice Y Chan
(74) *Attorney, Agent, or Firm* — McClure, Qualey & Rodack, LLP

(57) ABSTRACT

A semiconductor light-emitting structure and a semiconductor package structure thereof are provided. The semiconductor light-emitting structure includes a first-type semiconductor layer, an active layer, a second-type semiconductor layer, a metal layer and a distributed Bragg reflector. The active layer is disposed on the first-type semiconductor layer. The second-type semiconductor layer is disposed on the active layer. The metal layer is disposed on the second-type semiconductor layer as a first reflective structure, wherein the metal layer has an opening portion. The distributed Bragg reflector is disposed on the metal layer and interposed into the opening portion as a second reflective structure. The first reflective structure and the second reflective structure form a reflective surface on the second-type semiconductor layer.

11 Claims, 3 Drawing Sheets

(51) Int. Cl.
 *H01L 33/38* (2010.01)
 *H01L 33/50* (2010.01)
 *H01L 33/54* (2010.01)
 *H01L 33/60* (2010.01)
 *H01L 33/62* (2010.01)

(52) U.S. Cl.
 CPC ............ *H01L 33/505* (2013.01); *H01L 33/54* (2013.01); *H01L 33/60* (2013.01); *H01L 33/62* (2013.01)

(56) References Cited

U.S. PATENT DOCUMENTS

| | | |
|---|---|---|
| 8,378,376 B2 | 2/2013 | Chung et al. |
| 2012/0235114 A1* | 9/2012 | Tsang .................... H01L 33/382 257/13 |
| 2015/0155426 A1* | 6/2015 | Jeon ........................ H01L 33/46 438/29 |

FOREIGN PATENT DOCUMENTS

| | | |
|---|---|---|
| KR | 1020140031729 | 3/2014 |
| KR | 1020150000108 | 1/2015 |
| TW | 201104913 A | 2/2011 |
| TW | I389355 B | 3/2013 |
| TW | M460413 U | 8/2013 |
| TW | 201413915 A | 4/2014 |
| TW | I437738 B | 5/2014 |

\* cited by examiner

SEMICONDUCTOR LIGHT-EMITTING STRUCTURE WITH METAL LAYER AND DISTRIBUTED BRAGG REFLECTOR AND SEMICONDUCTOR PACKAGE STRUCTURE THEREOF

This application claims the benefit of Taiwan application Serial No. 104139725, filed Nov. 27, 2015, the present disclosure of which is incorporated by reference herein in its entirety.

TECHNICAL FIELD

The disclosure relates in general to a semiconductor light-emitting structure and a semiconductor package structure thereof, and more particularly to a semiconductor light-emitting structure including a metal layer and a distributed Bragg reflector and a semiconductor package structure thereof.

BACKGROUND

Light emitting diode (LED) emits a light by converting an electric energy into an optical energy. After a current is applied to the LED, the current is diffused and infused to an epitaxial layer of the LED, and electrons and holes are combined to emit energy. Therefore, after electrons and holes are combined, energy will be emitted in the form of a light.

Currently in the semiconductor industries, reflector is normally formed of metal (such as silver) or indium tin oxide/distributed Bragg reflector (ITO/DBR) during the manufacturing process of flip-chip LEDs. When the reflector is formed of silver, the contact system is formed of metal, and therefore possesses the advantages of better current diffusion and lower operating voltage. However, when the reflector is operated under an ordinary current, the efficiency of light extraction of the silver reflector is not as good as the ITO/DBR reflector. When the reflector is formed of ITO/DBR, the reflector can have a reflectivity near 100% provided that ITO is used as an Ohm contact layer for diffusing the current. When operated under an ordinary current, in comparison to the silver reflector, the ITO/DBR reflector has a better performance in terms of reflectivity but a worse performance in terms of element voltage. On the other hand, when the reflector is operated under a large current (such as larger than 1 ampere), the silver reflector has better performance in terms of reflectivity. Therefore, it has become a prominent task for the industries to provide a semiconductor light-emitting structure having the advantages of both the silver reflector and the ITO/DBR reflector.

SUMMARY

The invention is directed to a semiconductor light-emitting structure and a semiconductor package structure thereof in which a metal layer and a distributed Bragg reflector together form a reflector layer of the semiconductor light-emitting structure to increase the overall efficiency of light extraction.

According to one embodiment of the invention, a semiconductor light-emitting structure is provided. The semiconductor light-emitting structure includes a first-type semiconductor layer, an active layer, a second-type semiconductor layer, a metal layer and a distributed Bragg reflector. The active layer is disposed on the first-type semiconductor layer. The second-type semiconductor layer is disposed on the active layer. The metal layer is disposed on the second-type semiconductor layer as a first reflective structure, wherein the metal layer has an opening portion. The distributed Bragg reflector is disposed on the metal layer and interposed into the opening portion as a second reflective structure. The first reflective structure and the second reflective structure together form a reflective surface on the second-type semiconductor layer.

According to another embodiment of the invention, a semiconductor package structure is provided. The semiconductor package structure includes a carrier, the said semiconductor light-emitting structure and a wavelength conversion substance. The semiconductor light-emitting structure is reversely disposed on the carrier. The wavelength conversion substance covers the semiconductor light-emitting structure.

The above and other aspects of the invention will become better understood with regard to the following detailed description of the preferred but non-limiting embodiment(s). The following description is made with reference to the accompanying drawings.

DETAILED DESCRIPTION

The invention provides a semiconductor light-emitting structure, which can be formed of such as flip-chip LEDs and has a first electrode and a second electrode disposed on the same side. In an embodiment, the metal layer has a penetrating opening portion, and the distributed Bragg reflector is disposed on the metal layer and interposed into the opening portion. Thus, the reflector layer of the semiconductor light-emitting structure not only includes the metal layer but further includes the distributed Bragg reflector interposed into the opening portion, such that the semiconductor light-emitting structure can have a reflectivity as high as 99~100%. In comparison to the conventional semiconductor light-emitting structure whose reflector layer is formed of a metal layer only, the brightness of the semiconductor light-emitting structure of the invention is increased by about 3~5%. Moreover, the metal layer may further be used as a current diffusion layer for which uniformly diffusing the current to the second-type semiconductor layer, and may also be directly used as an Ohmic contact layer of the second-type semiconductor layer.

A number of embodiments are disclosed below. However, the embodiments of the invention are for detailed descriptions only, not for limiting the scope of protection of the invention.

Figure 1A:
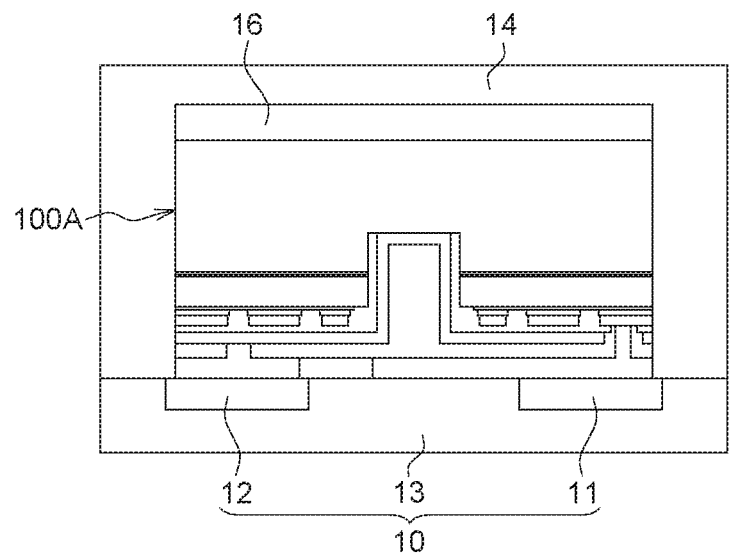
FIG. 1A is a cross-sectional view of a semiconductor package structure including a semiconductor light-emitting structure according to an embodiment of the invention.
Figure 1B:
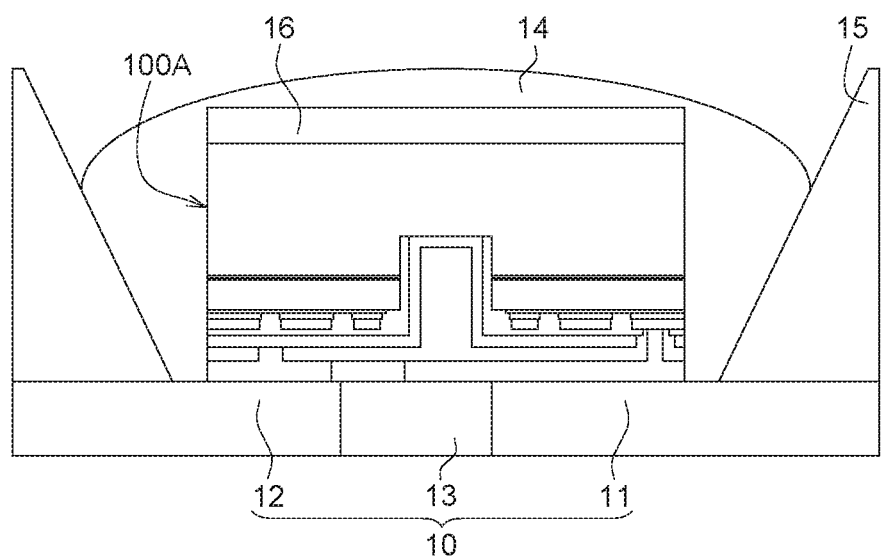
FIG. 1B is a cross-sectional view of another semiconductor package structure including a semiconductor light-emitting structure according to an embodiment of the invention.

FIG. 1A is a cross-sectional view of a semiconductor package structure 10A including a semiconductor light-emitting structure 100A according to an embodiment of the invention. FIG. 1B is a cross-sectional view of another semiconductor package structure 10B including a semiconductor light-emitting structure 100A according to an embodiment of the invention.

Referring to FIG. 1A, the semiconductor package structure 10A includes a carrier 10, a semiconductor light-emitting structure 100A and a wavelength conversion substance 14. The carrier 10 includes a first carrier electrode 11 (such as a negative electrode), a second carrier electrode 12 (such as a positive electrode) and an insulation layer 13. The wavelength conversion substance 14 covers the semiconductor light-emitting structure 100A, such that the emergent light can have different wavelengths.

The semiconductor light-emitting structure 100A of the invention, which can be formed of flip-chip LEDs, has a first electrode (not illustrated) and a second electrode (not illustrated) disposed on the same side, wherein the first electrode may be realized by such as an N-type electrode, and the second electrode may be realized by such as a P-type electrode. The semiconductor light-emitting structure 100A is reversely disposed on the carrier 10. The first electrode may be electrically connected with the first carrier electrode 11 of the carrier 10 via a conductive bump (not illustrated). The second electrode may be electrically connected with the second carrier electrode 12 of the carrier 10 via a conductive bump (not illustrated).

In an embodiment, the semiconductor light-emitting structure 100A may be formed on a substrate 16, which is used as a growth substrate for growing an epitaxial layer of the semiconductor light-emitting structure. The substrate 16 may be realized by such as a sapphire substrate. In another embodiment, since the substrate 16 may be removed before semiconductor is packaged on demand, the semiconductor package structure 10A may dispense with the substrate 16.

Refer to FIG. 1B. Since the semiconductor package structure 10B of FIG. 1B is similar to the semiconductor package structure 10A of FIG. 1A, common reference numerals are used in FIG. 1A and FIG. 1B and the detailed descriptions to indicate the same elements, and the similarities are not repeated here. The semiconductor package structure 10B further includes a dam 15, which is disposed on the carrier 10 and surrounds the semiconductor light-emitting structure 100A and the wavelength conversion substance 14 to increase the efficiency of light extraction of the semiconductor light-emitting structure 100A.

Detailed descriptions of the semiconductor light-emitting structure 100A are disclosed in an embodiment of the invention below. To keep the descriptions concise and easy to understand, descriptions of the substrate 16 are omitted.

Figure 2:
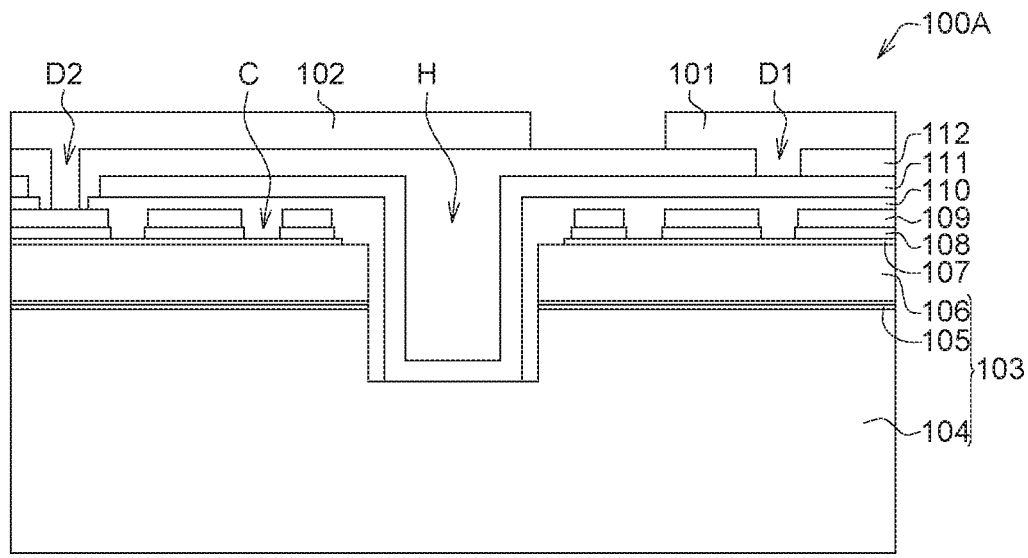
FIG. 2 is a cross-sectional view of a semiconductor light-emitting structure according to an embodiment of the invention.

Referring to FIG. 2, a cross-sectional view of a semiconductor light-emitting structure 100A according to an embodiment of the invention is shown. The semiconductor light-emitting structure 100A includes a first electrode 101, a second electrode 102 and an epitaxial layer 103. The first electrode 101 and the second electrode 102 are disposed on the same side of the epitaxial layer 103. The epitaxial layer 103 includes a first-type semiconductor layer 104, an active layer 105 and a second-type semiconductor layer 106, which are stacked in sequence. The first-type semiconductor layer 104, the active layer 105 and the second-type semiconductor layer 106 may be formed of a material selected from a group composed of gallium nitride (GaN), indium gallium nitride (InGaN), aluminum gallium nitride (AlGaN) and aluminum indium gallium nitride (AlInGaN) and any combinations thereof. The first-type semiconductor layer 104 and the second-type semiconductor layer 106 respectively have opposite polarities, for example, the first-type semiconductor layer 104 and the second-type semiconductor layer 106 may be an N-type semiconductor layer and a P-type semiconductor layer, respectively. The active layer 105 is interposed between the first semiconductor layer 104 and the second semiconductor layer 106. Electrons and electron holes, driven by a voltage, are transferred to the active layer 105 via the first-type semiconductor layer 104 and the second-type semiconductor layer 106. Then, the electrons and electron holes are combined on the active layer 105 and outputted in the form of light.

The semiconductor light-emitting structure 100A further includes a metal layer 108 and a distributed Bragg reflector 110. The metal layer 108 is disposed on the second-type semiconductor layer 106. The distributed Bragg reflector 110 is disposed on the metal layer 108. In the present embodiment, the metal layer 108 may be formed of silver and used as a first reflective structure of the semiconductor light-emitting structure 100A for reflecting the incident light. Additionally, the distributed Bragg reflector 110 may be formed of a dielectric material composed of a stack of alternating films with high refractive index and films with low refractive index. Due to the cyclic change of the refractive index between the films, the incident light generates constructive interference at the incident spot, and therefore cannot penetrate the distributed Bragg reflector 110 and will be reflected instead. In the present embodiment, the metal layer 108 may have an opening portion C, and the distributed Bragg reflector 110 may be interposed into the opening portion C and used as a second reflective structure of the semiconductor light-emitting structure 100A. Thus, the first reflective structure and the second reflective structure together may form a reflective surface on the second-type semiconductor layer 106.

In the present embodiment, the metal layer 108 may be used as the main reflective structure. Specifically, the area of the metal layer 108 formed on the reflective surface may be larger than the area of the distributed Bragg reflector 110 formed on the reflective surface. That is, the area ratio of the first reflective structure (composed of the metal layer 108) to the reflective surface may be larger than the area ratio of the second reflective structure (composed of the distributed Bragg reflector 110 interposed into the opening portion C) to the reflective surface.

The semiconductor light-emitting structure 100A may further include a barrier layer 109, a through hole H, a contact layer 111 and a protection layer 112. The barrier layer 109 is interposed between the metal layer 108 and the distributed Bragg reflector 110. The through hole H penetrates the second-type semiconductor layer 106, the active layer 105 and a part of the first-type semiconductor layer 104. The metal layer 108 and the barrier layer 109 are disposed on the surface of the second-type semiconductor layer 106 excluding the through hole H. The distributed Bragg reflector 110 is disposed on the metal layer 108, and further covers a side wall of the through hole H. The contact layer 111 is disposed on the distributed Bragg reflector 110 and extended to the through hole H to be electrically connected with the first-type semiconductor layer 104. Since the distributed Bragg reflector 110 is disposed on the metal layer 108 and further covers a side wall of the through hole H, the contact layer 111 may be electrically isolated from the metal layer 108 via the distributed Bragg reflector 110.

The protection layer 112 covers the contact layer 111, and may be extended to the through hole H. The protection layer 112 has a first recess D1 and a second recess D2. The first recess D1 exposes the surface of the contact layer 111. The first electrode 101 is disposed on the protection layer 112 and extended to the first recess D1 to be electrically connected with the contact layer 111. The second recess D2 exposes the surface of the barrier layer 109. The second electrode 102 is disposed on the protection layer 112 and extended to the second recess D2. The second electrode 102 is electrically connected with the metal layer 108 (disposed under the barrier layer 109) by diffusing current via the barrier layer 109.

Figure 3:
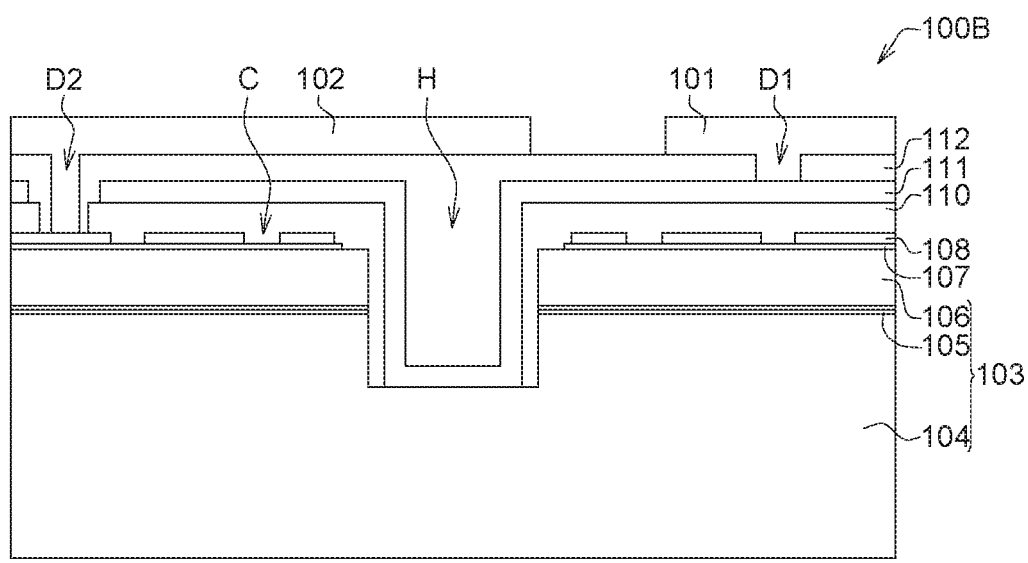
FIG. 3 is a cross-sectional view of a semiconductor light-emitting structure according to another embodiment of the invention.

In another embodiment, the semiconductor light-emitting structure may dispense with the barrier layer 109 and directly diffuse the current via the metal layer 108. As indicated in FIG. 3, the second recess D2 of the semiconductor light-emitting structure 100B may expose the metal layer 108, such that the second electrode 102 may be electrically connected with the metal layer 108 directly.

Figure 4:
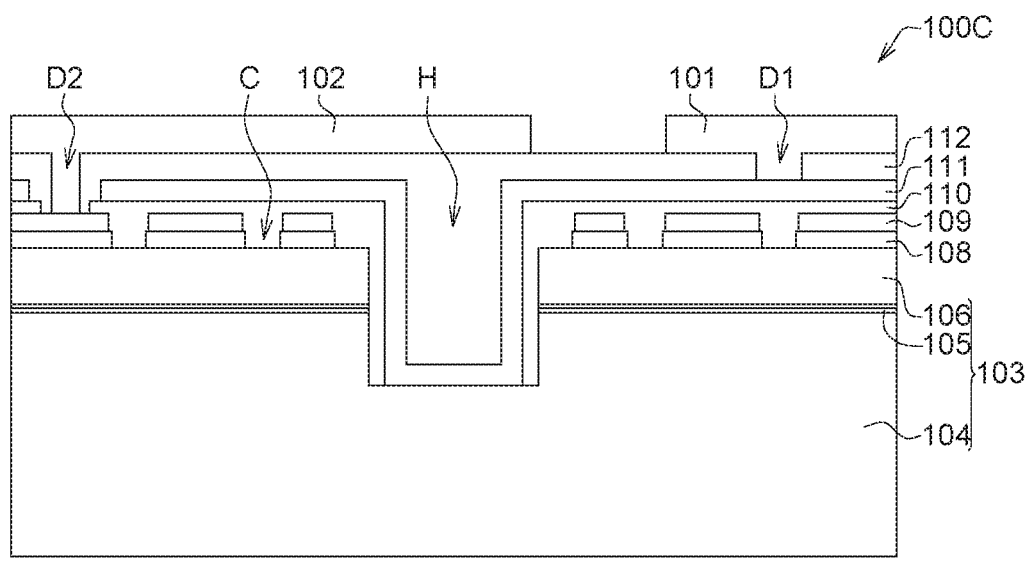
FIG. 4 is a cross-sectional view of a semiconductor light-emitting structure according to an alternate embodiment of the invention.

Refer to FIG. 2 again. The semiconductor light-emitting structure 100A may further include a transparent conductive layer 107 interposed between the second-type semiconductor layer 106 and the metal layer 108 and disposed on the surface of the second-type semiconductor layer 106 excluding the through hole H. The transparent conductive layer 107 may be formed of such as indium tin oxide (ITO) or indium zinc oxide (IZO). The transparent conductive layer 107 may be used as a current diffusion layer for uniformly diffusing the current to the second-type semiconductor layer 106, and may also be used as an Ohmic contact layer between the metal layer 108 and the second-type semiconductor layer 106 for reducing the contact resistance between the metal layer 108 and the second-type semiconductor layer 106. In another embodiment, the semiconductor light-emitting structure may dispense with the transparent conductive layer 107. As indicated in FIG. 4, the semiconductor light-emitting structure 100C may directly use the metal layer 108 as the Ohmic contact layer of the second-type semiconductor layer 106. That is, the present invention is not limited to the transparent conductive layer.

Figure 5:
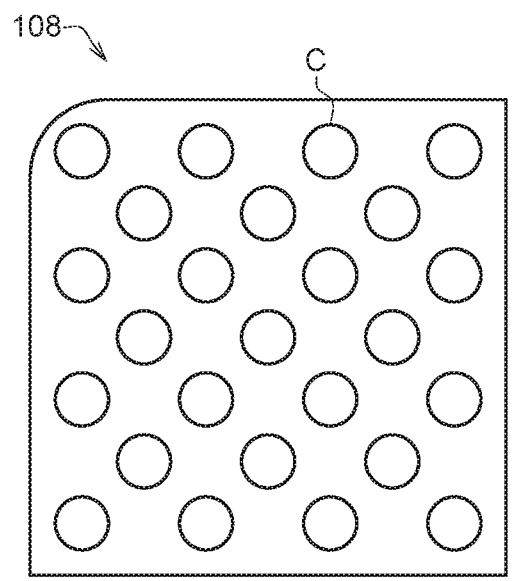
FIG. 5 is a schematic diagram of a metal layer of a semiconductor light-emitting structure according to an embodiment of the invention.

As indicated in FIG. 5, a reticular structure may be formed on the metal layer 108 by way of etching to achieve a better effect of current diffusion. The metal layer 108 with reticular structure may further include a plurality of opening portions C, which may be arranged at intervals. The distributed Bragg reflector 110 may be interposed into the opening portions C, such that the second-type semiconductor layer 106 has two reflective structures: the metal layer 108 and the distributed Bragg reflector 110. Also, the current may be diffused via the metal layer 108 excluding the opening portion C or via the transparent conductive layer 107 (disposed under the metal layer 108).

According to the semiconductor light-emitting structure disclosed in above embodiments of the invention, the metal layer has an opening portion, and the distributed Bragg reflector is disposed on the metal layer and further interposed into the opening portion. Thus, the reflector layer of the semiconductor light-emitting structure not only includes the metal layer, but further includes the distributed Bragg reflector interposed into the opening portion, such that the semiconductor light-emitting structure may have a reflectivity as high as 99~100%. In comparison to the conventional semiconductor light-emitting structure whose reflector layer is formed of a metal layer only, the brightness of the semiconductor light-emitting structure of the invention is increased by about 3~5%. Moreover, the metal layer may be used as a reflector layer as well as a current diffusion layer. Thus, the semiconductor light-emitting structure of the invention advantageously possesses the reflectivity of the distributed Bragg reflector and the current diffusion of the metal layer. Besides, the distributed Bragg reflector may be used as a reflector layer as well as an electrical insulation layer between the contact layer and the metal layer.

It will be apparent to those skilled in the art that various modifications and variations can be made to the disclosed embodiments. It is intended that the specification and examples be considered as exemplary only, with a true scope of the present disclosure being indicated by the following claims and their equivalents.

What is claimed is:

1. A semiconductor light-emitting structure, comprising:
   a first-type semiconductor layer;
   an active layer disposed on the first-type semiconductor layer;
   a second-type semiconductor layer disposed on the active layer;
   a metal layer disposed on the second-type semiconductor layer as a first reflective structure, wherein the metal layer has an opening portion;
   a distributed Bragg reflector disposed on the metal layer and interposed into the opening portion as a second reflective structure;
   a through hole penetrating the second-type semiconductor layer, the active layer and a part of the first-type semiconductor layer, wherein the distributed Bragg reflector covers a side wall of the through hole;
   a contact layer disposed on the distributed Bragg reflector and extended to the through hole to be electrically connected with the first-type semiconductor layer, wherein the contact layer is electrically isolated from the metal layer via the distributed Bragg reflector;
   a protection layer covering the contact layer and having a first recess and a second recess, wherein the first recess exposes the contact layer, and the second recess exposes the metal layer;
   a first electrode disposed on the protection layer and extended to the first recess to be electrically connected with the contact layer; and
   a second electrode disposed on the protection layer and extended to the second recess to be electrically connected with the metal layer;
   wherein the first reflective structure and the second reflective structure together form a reflective surface on the second-type semiconductor layer.

2. The semiconductor light-emitting structure according to claim 1, wherein the opening portion comprises a plurality of openings.

3. The semiconductor light-emitting structure according to claim 2, wherein the openings are arranged at intervals.

4. The semiconductor light-emitting structure according to claim 1, wherein an area ratio of the first reflective structure to the reflective surface is larger than an area ratio of the second reflective structure to the reflective surface.

5. A semiconductor light-emitting structure, comprising:
   a first-type semiconductor layer;
   an active layer disposed on the first-type semiconductor layer;
   a second-type semiconductor layer disposed on the active layer;

a metal layer disposed on the second-type semiconductor layer as a first reflective structure, wherein the metal layer has an opening portion;

a distributed Bragg reflector disposed on the metal layer and interposed into the opening portion as a second reflective structure;

a through hole penetrating the second-type semiconductor layer, the active layer and a part of the first-type semiconductor layer, wherein the distributed Bragg reflector covers a side wall of the through hole;

a contact layer disposed on the distributed Bragg reflector and extended to the through hole to be electrically connected with the first-type semiconductor layer, wherein the contact layer is electrically isolated from the metal layer via the distributed Bragg reflector;

a barrier layer interposed between the metal layer and the distributed Bragg reflector;

a protection layer covering the contact layer and having a first recess and a second recess, wherein the first recess exposes the contact layer, and the second recess exposes the barrier layer;

a first electrode disposed on the protection layer and extended to the first recess to be electrically connected with the contact layer; and a second electrode disposed on the protection layer and extended to the second recess to be electrically connected with the metal layer;

wherein the first reflective structure and the second reflective structure together form a reflective surface on the second-type semiconductor layer.

6. The semiconductor light-emitting structure according to claim 1 or claim 5, further comprising:

a transparent conductive layer interposed between the second-type semiconductor layer and the metal layer, wherein the transparent conductive layer is used as a current diffusion layer.

7. The semiconductor light-emitting structure according to claim 1 or claim 5, wherein the metal layer is reticulated.

8. A semiconductor package structure, comprising:

a carrier;

a semiconductor light-emitting structure according to claim 1 or claim 5 reversely disposed on the carrier; and a wavelength conversion substance covering the semiconductor light-emitting structure.

9. The semiconductor light-emitting structure according to claim 5, wherein the opening portion comprises a plurality of openings.

10. The semiconductor light-emitting structure according to claim 5, wherein the openings are arranged at intervals.

11. The semiconductor light-emitting structure according to claim 5, wherein an area ratio of the first reflective structure to the reflective surface is larger than an area ratio of the second reflective structure to the reflective surface.

* * * * *